(12) United States Patent
Hollberg et al.

(10) Patent No.: US 6,806,784 B2
(45) Date of Patent: Oct. 19, 2004

(54) MINIATURE FREQUENCY STANDARD BASED ON ALL-OPTICAL EXCITATION AND A MICRO-MACHINED CONTAINMENT VESSEL

(75) Inventors: Leo Hollberg, Boulder, CO (US); John Kitching, Boulder, CO (US)

(73) Assignees: The National Institute of Standards and Technology, Gaithersburg, MD (US); The United States of America, as represented by the Secretary of Commerce, Washington, DC (US)

(*) Notice: Subject to any disclaimer, the term of this patent is extended or adjusted under 35 U.S.C. 154(b) by 35 days.

(21) Appl. No.: 10/175,498

(22) Filed: Jun. 20, 2002

(65) Prior Publication Data

US 2002/0163394 A1 Nov. 7, 2002

Related U.S. Application Data

(60) Provisional application No. 60/303,877, filed on Jul. 9, 2001.

(51) Int. Cl.[7] .............................................. H03B 17/00
(52) U.S. Cl. ............................................ 331/94.1; 331/3
(58) Field of Search ........................... 331/94.1, 3, 176

(56) References Cited

U.S. PATENT DOCUMENTS

| | | | |
|---|---|---|---|
| 4,349,798 A | 9/1982 | Podell et al. | |
| 4,494,085 A | 1/1985 | Goldberg | |
| 4,495,478 A | 1/1985 | Kwon et al. | |
| 4,734,622 A | * 3/1988 | Stein | 315/111.81 |
| 5,192,921 A | 3/1993 | Chantry et al. | |
| 5,327,105 A | 7/1994 | Liberman et al. | |
| 5,670,914 A | 9/1997 | Liberman et al. | |
| 6,133,800 A | 10/2000 | Deng | |
| 6,201,821 B1 | 3/2001 | Zhu et al. | |
| 6,215,366 B1 | 4/2001 | Kern et al. | |
| 6,222,424 B1 | 4/2001 | Janssen et al. | |
| 6,225,870 B1 | 5/2001 | Mei et al. | |
| 6,255,647 B1 | 7/2001 | Vanier et al. | |
| 6,265,945 B1 | 7/2001 | Delaney et al. | |
| 6,320,472 B1 | 11/2001 | Vanier | |
| 6,359,916 B1 | 3/2002 | Zhu | |
| 6,359,917 B1 | 3/2002 | Cutler et al. | |
| 6,363,091 B1 | 3/2002 | Zhu et al. | |

* cited by examiner

Primary Examiner—Kenneth B. Wells
(74) Attorney, Agent, or Firm—Stevens, Davis, Miller & Mosher, LLP

(57) ABSTRACT

A microwave frequency standard is provided which allows for miniaturization down to length scales of order one micron, comprising a modulated light field originating from a laser that illuminates a collection of quantum absorbers contained in a micro-machined cell. The frequency standard of the present invention can be based on all-optical excitation techniques such as coherent population trapping (CPT) and stimulated Raman scattering or on conventional microwave-excited designs. In a CPT-based embodiment, a photodetector detects a change in transmitted power through the cell and that is used to stabilize an external oscillator to correspond to the absorber's transition frequency by locking the laser modulation frequency to the transition frequency. In a stimulated Raman scattering (SRS) embodiment, a high-speed photodetector detects a laser field transmitted through the cell beating with a second field originating in the cell. Both the locked laser modulation frequency and the beat frequency are very stable as they are referenced directly to the atomic transition.

20 Claims, 1 Drawing Sheet

MINIATURE FREQUENCY STANDARD BASED ON ALL-OPTICAL EXCITATION AND A MICRO-MACHINED CONTAINMENT VESSEL

CROSS REFERENCE TO RELATED APPLICATIONS

This application is a non-provisional application of provisional application No. 60/303,877 filed on Jul. 9, 2001, the entire contents of which is hereby incorporated by reference as if fully set forth herein.

BACKGROUND OF THE INVENTION

1. Field of the Invention

This invention relates to the field of frequency standards, and in particular, to a miniature atomic frequency standard allowing length scales down to the order of ten microns and apparatus for accomplishing the same.

2. Background of the Invention

Frequency stability is required for modern, high-speed communications, navigation, electronic instrumentation, and similar applications. Atomic frequency references or standards are based on the energy difference between two levels of a quantum system. In an atom, for example, quantum mechanics requires that the electrons can only exist in certain states with specific, discrete energies. Differences between the energies of these states define correspondingly specific frequencies that are, to a high degree, the same for every atom, and therefore atoms make good frequency references.

A dipole moment, oscillating at one of these frequencies, can be excited by an electromagnetic wave propagating in the same space as the atom. Frequency references are available that employ an excitation scheme in which microwave fields excite the atoms of a sample. When the microwave frequency is near the atomic oscillation frequency, a change in the atomic state occurs which can be detected by measuring the absorption or phase shift of an optical field propagating simultaneously through the atomic sample. The microwave excitation technique works well but poses problems for miniaturization since the microwaves are usually confined in a cavity necessitating a size scale constrained by the microwave wavelength.

All-optical excitation techniques have been developed, in which no microwaves are applied directly to the atoms. In one embodiment, an optical field produced by a laser is modulated with an external oscillator to produce two optical fields separated by the atomic oscillation frequency, and this laser field is passed through the atomic system. When the difference frequency of the two optical fields is near the atomic oscillation frequency, a change in the absorption or phase of the field by the atoms occurs. This change in absorption or phase, due to a phenomenon called coherent population trapping (CPT), can be used to lock the external oscillator frequency to the atomic transition. This locked frequency provides the output of the frequency reference and has the long-term stability and repeatability inherent to the atoms. Because no microwaves are applied directly to the atomic system, there is no constraint on the device size due to the microwave wavelength. As a result the system can be easily miniaturized to sub-cm dimensions. In addition, the device complexity associated with the microwave cavity is avoided in the all-optical frequency standard.

In another embodiment, the use of an external oscillator is avoided by using the atoms to generate the output microwave frequency directly. In this case, an optical field is sent through the atomic system and a second optical field is generated within the atomic system through the process of Raman scattering. These two fields produce a beatnote when incident on a high-speed photodetector; this beatnote becomes the output of the frequency reference. Since the output signal is generated directly from the atoms, no external oscillator (or microwave cavity) is necessary for the device to function.

Hence, all available atomic frequency standards generate a detection signal that quantifies a resonant interaction between and incident electromagnetic radiation and a quantum absorber.

U.S. Pat. No. 5,192,921 to Chantry et al., the entire contents of which is hereby incorporated by reference as if fully set forth herein, teaches a cell-type atomic frequency standard utilizing a miniaturized gas cell combined with a microwave cavity for excitation with an overall size that is on the order of 12 $cm^3$ when cesium is used as the vapor.

U.S. Pat. No. 5,327,105 to Liberman et al., the entire contents of which is hereby incorporated by reference as if fully set forth herein, teaches an atomic resonator that combines the functions of gas cell and resonator into a single structure which features, inter alia, allow reduction of the size of an atomic frequency standard to be reduced but not below 1 $cm^3$ overall.

U.S. Pat. No. 5,670,914 to Liberman et al., the entire contents of which is hereby incorporated by reference as if fully set forth herein, teaches a miniature atomic frequency standard that is on the order of 10 $cm^3$.

No prior art devices have been disclosed for atomic frequency references with sizes below ~1 $cm^3$.

SUMMARY OF THE INVENTION

The present invention provides an apparatus and a method for fabricating an atomic frequency standard with very stable output frequency with very small physical dimensions, possibly as small as 1000 $\mu m^3$. The atomic frequency standard, according to the present invention, is illustrated in schematic form in FIG. 1.

The compact micro-machined cell of the present invention can be used in an atomic frequency reference based on CPT, as illustrated in FIG. 2, or in a Raman-type oscillator, as illustrated in FIG. 3 or in a conventional microwave-excited design. In addition, the compact cell can be used in magnetometers based on Zeeman shifts in atomic systems, in which a known frequency from an external oscillator is compared to the frequency of an atomic transition known to be sensitive to magnetic fields. Finally the compact cell can be used in computational or information storage systems in which a series of vapor cells are networked together using optical fields and information is stored in the coherence properties of the quantum absorbers.

The frequency reference of the present invention is compact and very stable and reproducible over the short term. This kind of frequency reference can replace high-performance quartz-crystal oscillators in applications where long-term stability is required. The extremely small size and low power dissipation of the frequency reference of the present invention make it ideal for use in portable (hand-held) or remotely operated units, which operate on batteries or another limited power source. Other applications include LAN synchronization, instrumentation and calibration, secure communications, wireless communications, navigation (global positioning system) and radar systems. Additionally, the invention can be used in anti-jamming applications and in target identification systems.

DETAILED DESCRIPTION OF THE INVENTION

Figure 1:
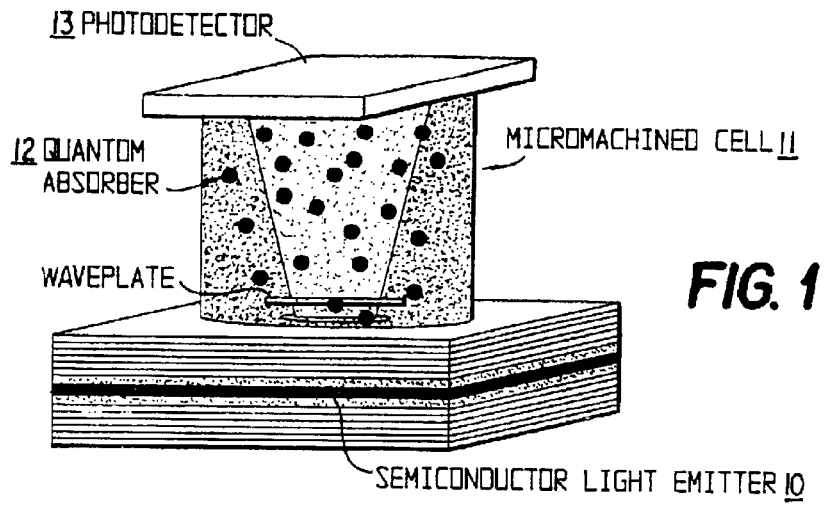
FIG. 1 illustrates an atomic frequency reference incorporating a micro-machined cell, according to the present invention.

The present invention provides an apparatus and a method for fabricating an atomic frequency standard with very stable output frequency in a very small package that can be as small as 1000 $\mu m^3$. The atomic frequency standard of the present invention is illustrated in outline in FIG. 1. Light from a semiconductor laser 10 is sent through a micro-machined cell 11 which encapsulates at least one quantum absorber 12. A photodetector 13, placed above the cell 11, collects the light transmitted through the vapor.

In a preferred embodiment, the encapsulation process is carried out using anodic bonding, in which a planar piece of silicon is bonded to a planar piece of glass using a combination of elevated temperature and an applied electric field. The bond is carried out in a controlled gaseous environment which enables an alkali atom vapor to be enclosed inside the cell.

In a preferred embodiment, the encapsulation process is carried out using compression bonding, in which a thin layer of metallic material is placed between two other materials, enclosing a small volume of space. The bond is activated by elevating the temperature of the interface.

Figure 2:
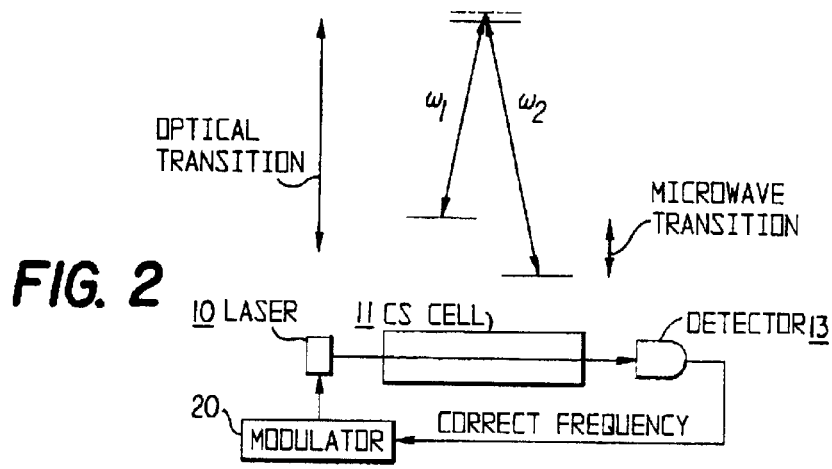
FIG. 2 illustrates the use of the micro-machined cell of the present invention in an atomic reference standard based on the phenomenon of coherent population trapping.

In a preferred embodiment, the interior of the encapsulated cell is combined with a method that reduces the destruction of the quantum absorber coherence due to collisions with the walls of the cell. Two such methods are known from prior art: the use of a coating on the walls of a cell and the use of a buffer gas of inert gas atoms enclosed inside the cell with the quantum absorbers. In one preferred embodiment, the present invention is used in a frequency reference based on the CPT phenomenon, as illustrated in FIG. 2 wherein the quantum absorber is cesium or rubidium vapor, but not restricted to these atomic species. In this embodiment, an external oscillator 20 is used to modulate the injection current of the laser 10, producing optical sidebands used for CPT. The optical transmission through the container of quantum absorbers 11 is monitored and changes when the frequency of the external oscillator 20 is near that of the quantum absorbers. This change in transmission can therefore be used to stabilize the external oscillator frequency. The fractional frequency instability is estimated to be on the order of $10^{-8}$ for an integration time of one second and a cell volume of 1000 $\mu m^3$.

Figure 3:
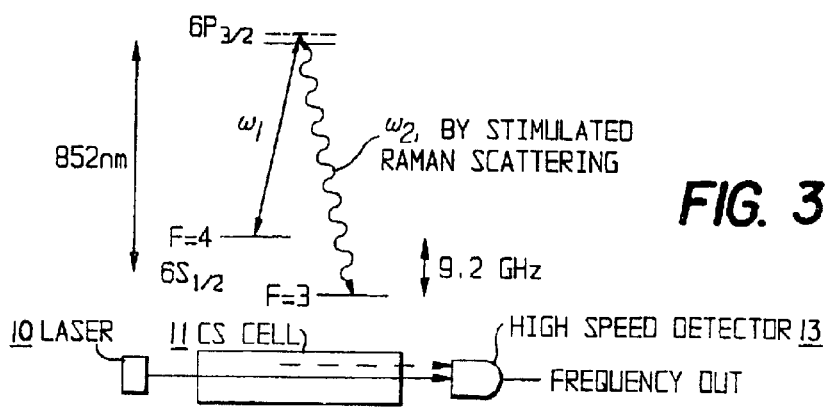
FIG. 3 illustrates the use of the micro-machined cell of the present invention in an atomic reference employing a Raman-type oscillator.

In another preferred embodiment the micro-machined cell of the present invention is used in a Raman-type oscillator, as illustrated in FIG. 3 wherein the quantum absorber is cesium vapor. Here there is no external frequency reference and a single-frequency optical field created by the laser 10 is sent through the cell 11. Through the process of stimulated Raman scattering, a second optical field is created, separated from the first by a frequency equal to the microwave transition in the quantum absorber 12. When these two optical fields are incident together on the photodetector, a beatnote is detected, with a frequency equal to the optical difference frequency. Since this beatnote frequency is derived from the quantum transition in the absorber, it can retain the intrinsic stability of the quantum system.

In another preferred embodiment, the micro-machined cell is used in a conventional microwave-excited design, in which an oscillating magnetic field is applied to the atoms using a microwave cavity or current loop. The atoms are optically pumped using an optical field from a laser or small lamp and the effect of the excitation is detected by measuring the change in transmission of the optical field through the cell.

One familiar with the art will realize that various fabrication methods are possible for the encapsulated micro-machined cell, depending on the particular application, and other all-optical excitation techniques can be employed, without departing from the essential scope or spirit of the invention as claimed. Accordingly, the examples of embodiments are presented, not in any limiting sense, but for purposes of illustration only.

What is claimed is:

1. A micro-machined cell for an atomic frequency standard comprising:
   a container having an interior, walls and a window to allow light to pass therethrough, said container operable to hold a vapor;
   a first vapor contained in said container, said first vapor comprising a plurality of quantum absorbers, said absorbers having a transition frequency; and
   means for reducing the destruction of the coherence of the quantum absorbers due to collisions of the quantum absorbers with the cell walls.

2. A micro-machined cell according to claim 1, wherein the means for reducing the destruction of the coherence of the quantum absorbers is a coating applied to the walls of the container.

3. A micro-machined cell according to claim 1, wherein the means for reducing the destruction of the coherence of the quantum absorbers is a second vapor of atoms enclosed inside the container.

4. A micro-machined cell according to claim 1, wherein the size of the cell is 1000 $\mu m^3$.

5. A micro-machined cell according to claim 1, wherein said cell is fabricated by bonding using a combination of elevated temperature and applied electric field of a plurality of cell materials in order to for said cell to enclose a small volume of space in an air-tight manner; wherein said plurality of quantum absorbers is enclosed in said small volume.

6. A micro-machined cell according to claim 1 wherein said cell is fabricated by compression bonding at an elevated temperature of a plurality of cell materials each separated by a thin layer of a metallic material.

7. An atomic frequency standard comprising:
   a micro-machined cell according to claim 1;
   a laser operable to generate light and positioned such that said light passes through said vapor; and
   a photodetector for detecting said light having passed through said vapor to provide a signal that is referenced to a characteristic of said detected light.

8. An atomic frequency standard according to claim 7 further comprising a system to apply an oscillating magnetic field to the quantum absorbers, wherein the photodetector monitors said detected light to provide adjustments to the frequency of said oscillating magnetic field, detects a frequency of modulation that coincides with one of said quantum absorbers, a harmonic of said quantum absorber frequency or a subharmonic of said quantum absorber frequency by detecting a change in the detected light and outputs the detected frequency as a reference.

9. An atomic frequency standard according to claim 7, further comprising an external oscillator to modulate an injection current of the laser to produce optical sidebands for coherent population trapping, wherein the photodetector monitors said detected light to provide adjustments to the frequency of modulation of the external oscillator, detects a frequency of modulation that coincides exactly with the quantum absorbers, a harmonic of the quantum absorber frequency, or a subharmonic of the quantum absorber frequency, by detecting a change in the detected light and outputs the detected frequency as a reference.

10. An atomic frequency standard according to claim 7, further comprising:
- a single-frequency first optical field created by said laser;
- a second optical field, created through the process of Raman scattering, separated from the first field by a frequency equal to the transition in the quantum absorbers, wherein said photodetector detects a beatnote having a frequency equal to the optical difference frequency between the first and second fields and outputs said beatnote frequency as a reference.

11. A method for a micro-machined cell of an atomic frequency standard, comprising the steps of:
- micro-machining a container as a quantum resonator to have walls and a window to allow light to pass therethrough, said container operable to hold a vapor;
- enclosing in said cell a vapor comprising a plurality of quantum absorbers having a transition frequency; and
reducing the destruction of the coherence of the quantum absorbers due to collisions of the quantum absorbers with the container walls.

12. A method of fabricating a micro-machined cell according to claim 11 further comprising the steps of bonding silicon to glass using a combination of elevated temperature and applied electric field in order for said container to enclose a small volume in an air-tight manner.

13. The atomic frequency reference of claim 7, wherein said vapor comprises an alkali atom.

14. The atomic frequency reference of claim 13 wherein said alkali atom is one of cesium, rubidium, and potassium.

15. A LAN comprising the atomic frequency reference of claim 7.

16. An instrument calibration system comprising the atomic frequency reference of claim 7.

17. An identification system comprising the atomic frequency reference of claim 7.

18. An anti-jamming apparatus comprising the atomic frequency reference of claim 7.

19. A magnetometer comprising:
- a micro-machined cell according to claim 1;
- a laser operable to generate light and positioned such that said light passes through said vapor; and
- a photodetector for detecting said light having passed through said vapor to provide a signal that is referenced to a characteristic of said light.

20. A computational device based on a network of micro-machined cells according to claim 1 wherein said cells are used to store information by encoding at least one coherence property of the quantum absorber.

* * * * *